United States Patent
Liskow (10) Patent No.: US 10,098,240 B2
(45) Date of Patent: Oct. 9, 2018

(54) ELECTRONIC CONTROL MODULE AND METHOD FOR PRODUCING AN ELECTRONIC CONTROL MODULE

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/106,634

(22) PCT Filed: Nov. 10, 2014

(86) PCT No.: PCT/EP2014/074189
§ 371 (c)(1),
(2) Date: Jun. 20, 2016

(87) PCT Pub. No.: WO2015/090732
PCT Pub. Date: Jun. 25, 2015

(65) Prior Publication Data
US 2017/0006711 A1 Jan. 5, 2017

(30) Foreign Application Priority Data
Dec. 20, 2013 (DE) .................. 10 2013 227 003

(51) Int. Cl.
*H05K 3/32* (2006.01)
*H05K 3/34* (2006.01)
(Continued)

(52) U.S. Cl.
CPC ........... *H05K 3/328* (2013.01); *H05K 1/0206* (2013.01); *H05K 1/115* (2013.01); *H05K 1/181* (2013.01);
(Continued)

(58) Field of Classification Search
CPC ............ H05K 3/30; H05K 3/32; H05K 3/321; H05K 3/326; H05K 3/3421;
(Continued)

(56) References Cited

U.S. PATENT DOCUMENTS

2008/0144260 A1  6/2008 Honda
2009/0176402 A1  7/2009 Honda
(Continued)

FOREIGN PATENT DOCUMENTS

DE         100 62 962 A1   7/2002
DE    10 2011 083 576 A1   3/2013
(Continued)

OTHER PUBLICATIONS

International Search Report corresponding to PCT Application No. PCT/EP2014/074189, dated Jan. 21, 2015 (German and English language document) (5 pages).

*Primary Examiner* — Ishwarbhai B Patel
*Assistant Examiner* — Paresh Paghadal
(74) *Attorney, Agent, or Firm* — Maginot, Moore & Beck LLP (57) ABSTRACT

An electronic control module includes a printed circuit board and an electrical component. The circuit board has a contact area arranged on a component side. The electrical component has an electrical connection element with a connection section running parallel to the component side and is electrically connected to the contact area. An adapter is arranged on the circuit board independently of the electrical component and has a holding body fastened to the circuit board outside the contact area and a metal web. The web is arranged on the holding body and has a contact section running parallel to the component side. The contact section and the connection section lie atop another and are welded to one another in a covering area. The web or the
(Continued)

connection element makes electrical contact with the contact area by an electrically conductive material applied to the contact area.

10 Claims, 6 Drawing Sheets

(51) Int. Cl.
  *H05K 5/00*   (2006.01)
  *H05K 1/02*   (2006.01)
  *H05K 1/18*   (2006.01)
  H05K 3/30   (2006.01)
  H01R 12/51   (2011.01)
  H01R 12/57   (2011.01)
  H01R 12/62   (2011.01)
  H05K 1/11   (2006.01)

(52) U.S. Cl.
  CPC ............ *H05K 3/32* (2013.01); *H05K 3/3421* (2013.01); *H05K 5/0082* (2013.01); *H01R 12/51* (2013.01); *H01R 12/57* (2013.01); *H01R 12/62* (2013.01); *H05K 1/113* (2013.01); *H05K 3/30* (2013.01); *H05K 3/321* (2013.01); *H05K 3/326* (2013.01); *H05K 2201/09063* (2013.01); *H05K 2201/1028* (2013.01); *H05K 2201/10204* (2013.01); *H05K 2201/10628* (2013.01); *H05K 2201/10962* (2013.01); *H05K 2203/107* (2013.01); *Y02P 70/613* (2015.11)

(58) Field of Classification Search
  CPC .......... H05K 2201/10295; H05K 2201/10515; H05K 2201/10924; H05K 2201/10962; H05K 2201/2018; H05K 1/115; H05K 1/0206; H05K 1/181; H05K 1/3421; H05K 1/113; H05K 3/328; H05K 5/0082; H05K 2203/107; H05K 2201/10204; H05K 2201/1028; H05K 2201/10628; H05K 2201/09063; H01R 12/57; H01R 12/62; Y02P 70/613
  See application file for complete search history.

(56) References Cited

U.S. PATENT DOCUMENTS

2010/0285676 A1* 11/2010 Ikeuchi .................. H01R 12/57
                    439/65
2012/0037403 A1* 2/2012 Liskow .................. H05K 3/368
                    174/251

FOREIGN PATENT DOCUMENTS

| DE | 10 2011 088 335 A1 | 6/2013 |
| DE | 10 2011 088 620 A1 | 6/2013 |
| JP | H05-160550 A | 6/1993 |
| WO | 2008/031366 A1 | 3/2008 |

\* cited by examiner

ELECTRONIC CONTROL MODULE AND METHOD FOR PRODUCING AN ELECTRONIC CONTROL MODULE

This application is a 35 U.S.C. § 371 National Stage Application of PCT/EP2014/074189, filed on Nov. 10, 2014, which claims the benefit of priority to Serial No. DE 10 2013 227 003.8, filed on Dec. 20, 2013 in Germany, the disclosures of which are incorporated herein by reference in their entireties.

BACKGROUND

The disclosure relates to an electronic control module, in particular for a transmission controller, and to a method for producing such an electronic control module.

In motor vehicle engineering, electronic control modules which can be arranged on the transmission and in the transmission fluid are used for actuating the transmission. The control modules can have, for example, electrical components such as plugs, sensors, actuators, at least one encapsulated control unit (TCU, transmission control unit) and, if appropriate, further components which are attached to a central carrier and are subjected to the transmission fluid. The arrangement in the transmission fluid is very challenging for the design technology and connecting technology of the components on the carrier of the electronic control module, since the electrical connections have to be able to withstand high alternating temperature stresses as well as the transmission fluid with metal swarf contained therein in an unfavorable case. In the prior art, cut matrices which are encapsulated by injection molding as well as rigid printed circuit boards or flexible printed circuit boards (referred to as flex foils) are used as carriers of the electrical connecting technology.

A customary contact-forming technology of electrical components on printed circuit boards consists in soldering electrical connection elements of the components using plug-through mounting in contact-forming openings of the printed circuit board. Therefore, for example, US 2009/0176402 A1 and US 2008/0144260 A1 show plug parts whose connection elements are soldered into vias of the printed circuit board. A disadvantage of this connecting technology for the application in transmission oil is that the connection elements project through onto the underside of the printed circuit board and covers and protective measures are therefore necessary on the underside in order to prevent depositing of metal swarf and resulting short-circuits.

Recently, electronic control modules have been developed for a transmission controller, which control modules preferably use a rigid printed circuit board as a carrier of the electrical connecting technology, wherein electrical components can be applied to the printed circuit board using surface mounting. Therefore, an electronic control module with a printed circuit board which is applied on a carrier plate is known form DE 10 2011 088 335 A1. An electronic SMD component has connection elements with connection sections which run parallel to the component side of the printed circuit board and are soldered to corresponding contact areas on the component side of the printed circuit board. The contact areas referred to as solder areas in DE 10 2011 088 335 A1 are electrically connected to conductor tracks in the interior of the printed circuit board using VIAs (Vertical Interconnected Access), which are also referred to as intermediate connectors or vias. DE 10 2011 088 335 A1 proposes a holding-down device in order to press the connection sections onto the contact area during the soldering process and to prevent the connection section from rebounding out of the liquid solder.

In addition, DE 2011 088 620 A1 discloses an electronic circuit for an automatic transmission of a motor vehicle, in which automatic transmission a plug housing is secured to a printed circuit board by means of a latching element, and a connection pin of the plug housing has a wire section which is introduced into a metalized via of the printed circuit board and soldered therein. Furthermore, DE 100 62 962 A1 discloses inserting large electrical components into a holding frame and applying the component together with the holding frame to the printed circuit board, wherein the connection pins which are arranged on the holding frame are introduced into the printed circuit board through vias and soldered to said printed circuit board.

SUMMARY

According to the disclosure, an electronic control module is proposed in which at least one adapter is arranged on the printed circuit board, which adapter is arranged, independently of the at least one electrical component, as a separate part on the printed circuit board and has a holding body which is attached to the printed circuit board outside the at least one contact area, and at least one metallic web which is arranged on the holding body and has a contact section running parallel to the component side of the printed circuit board, wherein the contact section of the at least one metallic web and the connection section of the at least one connection element are arranged, when viewed in a direction perpendicular to the printed circuit board, resting one on the other in an overlapping region and are welded to one another in the overlapping region, and in that the at least one metallic web or at the at least one connection element are placed in electrical contact with the at least one contact area by means of an electrically conductive material applied to the at least one contact area. Each adapter can have one or more metallic webs which are then each assigned to the connection elements of one or more electrical components. A plurality of adapters can be mounted on the printed circuit board, completely independently of the electrical components. In particular, the adapter can be applied before or after the application of the electrical components. Each adapter has a holding body with which it can be mechanically attached to the printed circuit board outside the printed circuit board region which is provided with the contact areas. The disclosure therefore permits a new contact-forming concept for surface-mounted electrical components which can be welded with their connection elements to the assigned metallic webs of the adapters. The electrical connection to the printed circuit board is made by means of an electrically conductive material on the contact area of the printed circuit board, which material is electrically connected to the connection element or to the metallic web.

The disclosure also relates to a method for producing an electronic control module according to the following description, wherein two alternative methods are possible depending on whether the connection elements of the electrical components or the metallic webs of the contact elements of the adapters are to be directly connected to the contact areas of the printed circuit board by means of the electrically conductive material. In particular, mixed forms of the two variants in which individual contact-forming processes are carried out according to the one method and other contact-forming processes are carried out according to the other method are also possible.

The components of the TCU which are associated with the control circuit can also be applied to the printed circuit board in a pre-production stage and placed in contact with the conductor tracks by means of bonding wires. The mounting of further electrical components such as plugs and sensors can subsequently take place in a rapidly cycled fabrication line without further individual thermal processes or soldering steps being necessary on the underside of the printed circuit board.

For the application in the transmission oil it is advantageous if the electrical connection elements are electrically connectable to contacts on the printed circuit board in a welding process, and no connection pins project through onto the underside of the printed circuit board facing away from the component side of the printed circuit board. As a result, installation space requirement on the printed circuit board is advantageously saved by eliminating the plug-through connections. A welding process is advantageously provided according to the disclosure in order to weld a connection element of an electrical component mounted on the component side of the printed circuit board to a metallic web of the adapter, and as a result advantageously ensure a stable and reliable electrical connection between the connection element and the web. The orientation of the connection section of the connection element and the contact section of the metallic web is particularly advantageously parallel to the component side of the printed circuit board, wherein the contact section of the at least one metallic web and the connection section of the at least one connection element are arranged, when viewed in a direction perpendicular to the printed circuit board, resting one on top of the other in an overlapping region. This measure ensures that welding can be carried out with a laser perpendicular to the component side of the printed circuit board. Owing to the spatially extended overlapping region, the contact region between the contact section and the connection section is robust with respect to positional tolerances of the electrical component. The welding is preferably carried out with the laser in the overlapping region.

According to the disclosure, the electrical connection of the at least one electrical component to the printed circuit board is effected in that either the at least one metallic web or the at least one connection element, depending on which is arranged over the contact area, is placed in electrical contact with the at least one contact area by means of an electrically conductive material which is applied to the at least one contact area. Solder or a curable adhesive can be used as the electrically conductive material.

The electrical connection, produced by means of the electrically conductive material, to the at least one contact area of the printed circuit board is particularly advantageously relieved of loading by the welded connection between the at least one connection element and the at least one metallic web and by the mechanical securement of the adapter to the printed circuit board which is independent of the electrical connection to the printed circuit board. Thermal stresses and vibrational loading can therefore be absorbed by means of the stable mechanical attachment of the adapter, with the result that lateral forces and vertical forces are kept away from the connection which is produced by means of the electrically conductive material. The forces are advantageously absorbed by the printed circuit board by means of the holding body of the adapter. Therefore, the loading on the soldered point can be relieved, in particular in the event of solder being used as electrically conductive material.

Advantageous refinements and developments of the disclosure are made possible by the features contained in the following description.

The electronic control module advantageously has an adapter with a holding body which has at least one attachment pin which is inserted into an insertion opening in the printed circuit board. The attachment pin can be clamped, for example, in the insertion opening in the printed circuit board. In this context, the attachment pin simultaneously closes the insertion opening in the printed circuit board. Since the attachment pin in the insertion opening has, in contrast to a pin in a via, no electrical function, no openings which contain electrically conductive parts are advantageously contained on the underside of the printed circuit board. The attachment pin can advantageously be embodied in one piece with the holding body.

The holding body of the at least one adapter can be fabricated from plastic. The adapter can be manufactured, for example, in a cost-effective fashion as a simple injection molded part in which the metallic web is encapsulated by injection molding with the plastic of the holding body. The attachment pin of the holding body can be produced simultaneously with the encapsulation of the metallic web by injection molding on the holding body.

In one particularly simple exemplary embodiment, the at least one metallic web projects laterally from the holding body, parallel to the printed circuit board, at least on one side of the holding body. The metallic web is secured by its other, non-free end in the holding body. The orientation of the web in the end position of the adapter is important when said adapter is secured to the printed circuit board. It is therefore possible that the metallic web is initially not placed precisely perpendicularly with respect to the attachment pin and is placed slightly obliquely with respect to the component side of the printed circuit board, but then abuts in the end position against the contact area or against the connection element of an electrical component and is bent back elastically parallel to the component side of the printed circuit board as the attachment pin is inserted into the insertion opening. At the same time, a prestressing force which acts in the direction of the contact area is then applied by the metallic web.

The at least one contact area of the printed circuit board is advantageously arranged, when viewed in a direction perpendicular to the printed circuit board, underneath the overlapping region of the contact section and connection section. As a result it can be advantageously ensured that when the contact section and the connection section are laser welded a deposit of solder on the contact area can simultaneously also be particularly easily melted by the inputting of heat by the welding process. Furthermore, the solder point is relieved of loading in an optimum way by the welding point which is arranged directly over it.

The welding process can be carried out particularly reliably if the contact section of the at least one web and the connection section of the at least one connection element are formed by metal strips which have a rectangular cross section and are arranged resting flat one on top of the other at least in the overlapping region.

The at least one electrical component and the at least one adapter can advantageously be applied independently of one another to the printed circuit board. It is possible here for the electrical component to be firstly mounted on the printed circuit board, with the result that the connection section of the at least one connection element is in direct contact with the electrically conductive material on the at least one contact area of the printed circuit board. During the subsequent arrangement of the adapter, the contact section of the at least one metallic web can rest on the connection section, on the side of said connection section which faces away from the at least one contact area. However, it is likewise also possible firstly to mount the adapter on the printed circuit board, with the result that the contact section of the at least one metallic web is in direct contact with the electrically conductive material on the at least one contact area of the printed circuit board, and to apply the electrical component subsequently to the printed circuit board, with the result that the connection section of the at least one connection element rests on the contact section, on the side of said contact section which faces away from the at least one contact area. In both cases, the connecting party which respectively faces away from the contact area can apply a prestressing force to the other contact party which is arranged between it and the contact area.

Furthermore, a method of producing the electronic control module according to the disclosure having the following steps is advantageous:
  making available a printed circuit board with a component side on which at least one contact area is arranged,
  applying an electrically conducting material to the at least one contact area,
  arranging at least one adapter on the printed circuit board, wherein the at least one adapter has a holding body for attachment to the printed circuit board outside the at least one contact area, and at least one metallic web which is arranged on the holding body and has a contact section running parallel to the component side of the printed circuit board at least in the end position of the adapter in which it is attached to the printed circuit board, wherein the at least one metallic web is arranged directly over the at least one contact area which is provided with electrically conductive material,
  arranging at least one electrical component on the printed circuit board which is provided with the at least one adapter, wherein the at least one electrical component has at least one electrical connection element which has a connection section running parallel to the component side of the printed circuit board, wherein the connection section is arranged resting directly on the contact section in an overlapping region, and
  welding the connection section to the contact section.

In this method, the application of the adapter advantageously generates a welding area (by means of the metallic web) on the printed circuit board, which welding area is electrically connected to the contact area of the printed circuit board. When welding is carried out with, for example, one laser, the connection section is molten in a narrow region, and the metallic web lying underneath it is molten, and said connection section and metallic web are as a result connected to one another. The web reliably prevents the laser from penetrating the contact area or the material of the printed circuit board, since the connection section is not welded directly with the contact area. Since heat is only fed in locally during the laser welding and heating and cooling does not take place over a large area, stresses hardly occur during the fabrication. The relatively short distance between the welding point and the mechanical holding point of the adapter is advantageous here with the result that no large mechanical stresses occur between the holding point, that is to say for example the attachment pin engaging in the insertion opening, and the welding point as well as the electrical connection to the contact area.

Before the step of arranging the at least one electrical component, the metallic web can advantageously be connected in a materially joined fashion to the contact area by means of the electrically conductive material. This can be done, for example, with solder as the material and in a vapor phase soldering system.

If the electrically conductive material is a solder it can also be provided that, during the step of welding the connection section to the contact section, the metallic web is simultaneously soldered to the contact area by means of the input of heat by the welding process.

Furthermore, a production method having the electronic control module according to the disclosure having the following steps is advantageous:
  making available a printed circuit board with a component side on which at least one contact area is arranged,
  applying an electrically conductive material to the at least one contact area,
  arranging at least one electrical component on the printed circuit board, wherein the at least one electrical component has at least one electrical connection element which has a connection section running parallel to the component side of the printed circuit board, wherein the at least one connection element is arranged directly over the contact area which is provided with the electrically conductive material,
  arranging at least one adapter on the printed circuit board which is provided with the at least one electrical component, wherein the at least one adapter has a holding body for attachment to the printed circuit board outside the at least one contact area, and at least one metallic web which is arranged on the holding body and has a contact section which runs parallel to the component side of the printed circuit board, at least in the end position of the adapter in which it is attached to the printed circuit board, wherein the contact section is arranged resting directly on the connection section in an overlapping region, and
  welding the contact section to the connection section.

In this method, the electrical component is firstly mounted on the printed circuit board. The adapter is only mounted subsequently. When welding is carried out with the laser, it is also ensured here that the metallic web melts in the region of the contact section, and the melting zone penetrates as far as the connection section of the connection element. Damage to the contact area or the material of the printed circuit board is also avoided here.

Before the step of arranging at least one adapter, the at least one connection element can be connected in a materially joined fashion to the contact area by means of the electrically conductive material.

If a solder is used as the electrically conductive material, during the step of welding the contact section to the connection section, the connection element can advantageously be simultaneously soldered to the contact area by means of the input of heat by the welding process. If appropriate, after the time which is necessary for the welding process, the laser can also briefly input heat, with low power, into the connecting point, in order to achieve reliable melting of the solder.

BRIEF DESCRIPTION OF THE DRAWINGS

Exemplary embodiments of the disclosure are illustrated in the drawing and explained in more detail in the following description, in which:

FIG. 4 shows an alternative embodiment to FIG. 3, FIGS. 5a, 5b and 5c show side views of an adapter which is illustrated by way of example, with a holding body and a metallic web.

DETAILED DESCRIPTION

Figure 1:
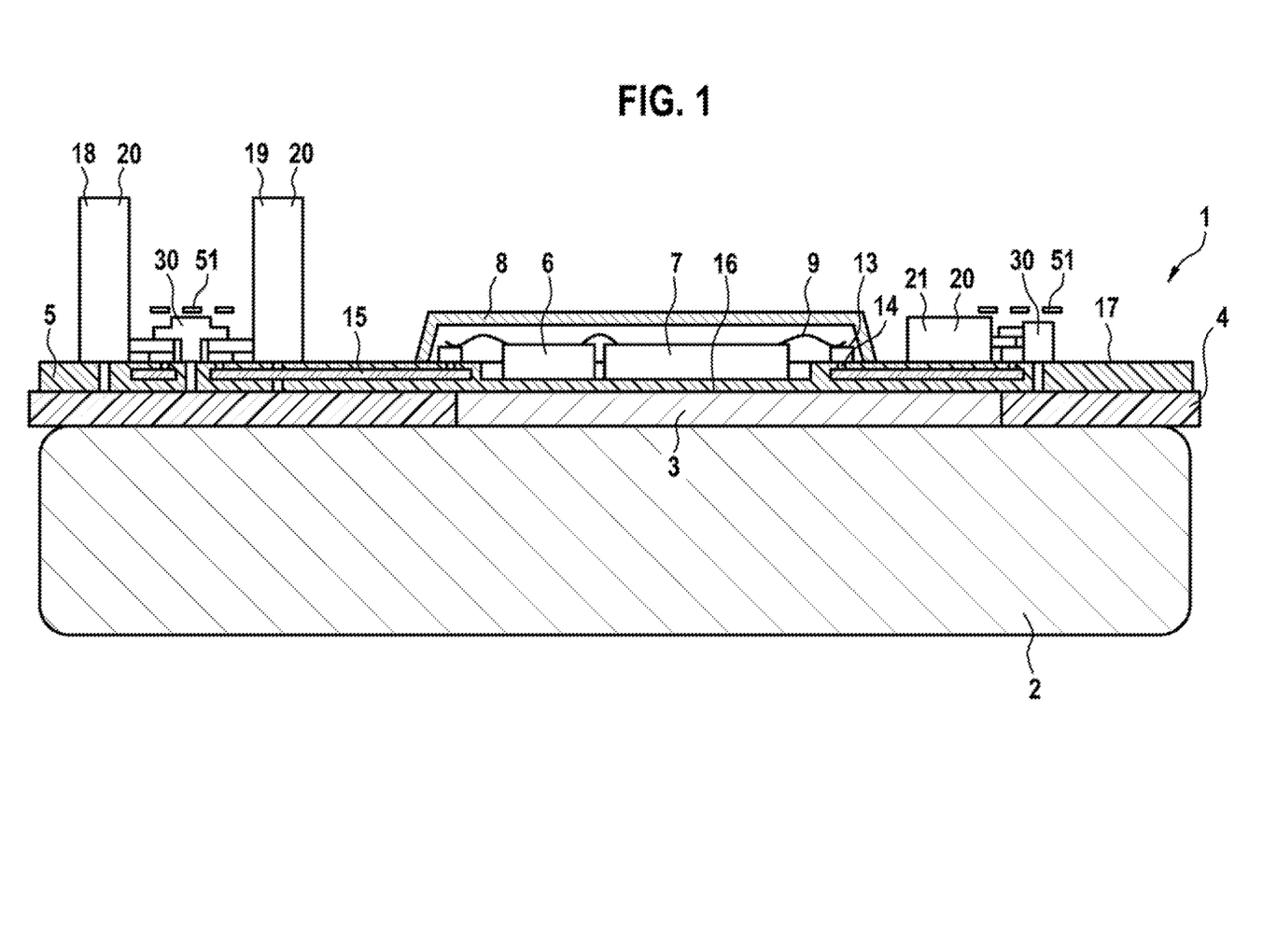
FIG. 1 shows a cross section through an electronic control module according to the disclosure, which is mounted on a transmission hydraulic plate by means of an intermediate plate.

FIG. 1 shows a cross section through an electronic control module 1 for a motor vehicle transmission. The electronic control module 1 has a printed circuit board 5 as a carrier of the construction and connection technology. The printed circuit board is a rigid printed circuit board, for example a printed circuit board of an FR4 design or of a higher value, that is to say, for example, a printed circuit board made of glass-fiber-reinforced epoxy resin. The printed circuit board has, in its interior, at least one or more parallel layers provided with conductor tracks 15. The connection of the conductor tracks of different layers is made via intermediate connections (VIAs), which are also referred to as vias. The printed circuit board 5 has a component side 17 and an underside 16 facing away from the latter. The conductor tracks 15 are also electrically connected to contact areas 13 of the component side 17 of the printed circuit board 5 via intermediate connections 14. The component side 17 of the printed circuit board 5 is intended to be populated with components, while the underside 16 facing away therefrom is not populated with components. As can be seen in FIG. 1, the printed circuit board 5 has, in its central region on the component side 17, a trough-shaped recess which is produced, for example, by milling, and in which an electronic circuit part 7 and power electronics 6 are arranged, these being bonded, for example, onto the base of the trough-shaped recess and being electrically connected to one another and to the contact areas 13 by means of bonding wires 9. Of course, the components 6, 7 can also be applied directly to the printed circuit board 5 without the trough-shaped recess. Furthermore, thermal VIAs can also be arranged in the printed circuit board 5 in the region of the heat-generating components of the electronic circuit part 7 or the power electronic 6, said thermal VIAs merely permitting heat to be conducted away to the underside 16 of the printed circuit board 5 and not having an electrical function.

The trough-shaped region which is provided with the electronic circuit part 7 and the power electronics 6, on the component side 17 of the printed circuit board 5, is covered in a sealed fashion with a cover 8. The cover 8 prevents the ingress of transmission fluid into the housing space under the cover, with the result that the components arranged there are encapsulated with respect to the exterior space. In addition, the housing space under the cover 8 can be filled, for example, with a gel in order to protect the components arranged there. The electrical connection of the electronic components under the cover 8 with components which are arranged outside the cover is made via the conductor tracks 15. In FIG. 1, the electrical components 20 which are arranged outside the cover 8 are illustrated. These can be, for example, a plug 18, an actuator 19 or a sensor component 21. Furthermore, adapters 30, which are attached, for example, to attachment pins in the insertion openings in the printed circuit board 5, are provided on the component side 17. Each electronic component 20 outside the cover 8 is assigned at least one adapter 30. This is explained in more detail with reference to FIGS. 3 and 4. The underside 16 of the printed circuit board 5 in FIG. 1 is mounted on a plastic carrier plate 4. The plastic carrier plate 4 has a metal inlay 3 underneath the electronic circuit part 7 and the power electronics 6, via which metal inlay 3 the heat which is carried away by the thermal VIAs is carried away to the hydraulic plate 2 of the transmission.

Figure 2:
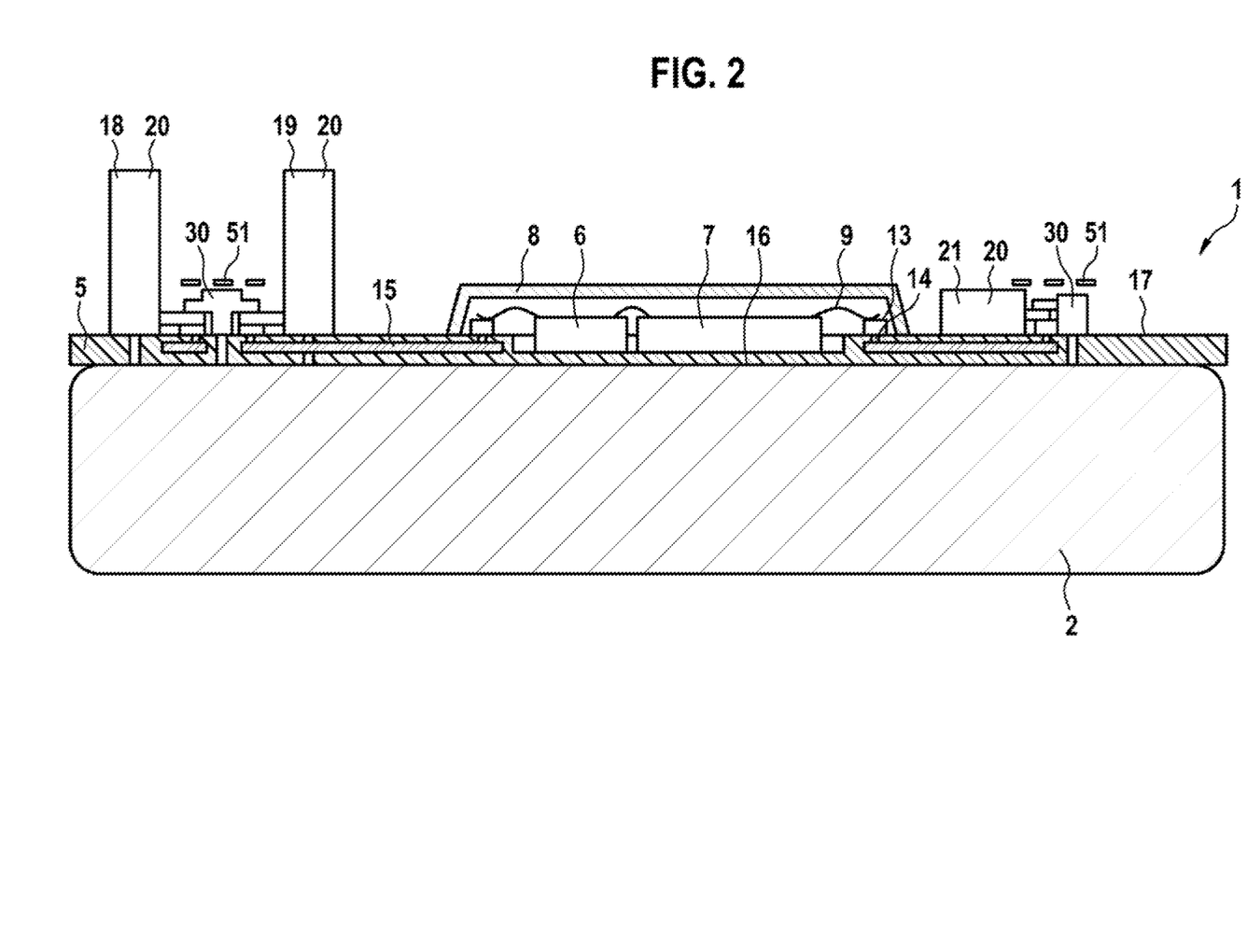
FIG. 2 shows a cross section through an electronic control module according to the disclosure, which is mounted directly on a transmission hydraulic plate.

FIG. 2 discloses a further embodiment in which the control module 1 is applied directly to the hydraulic plate 2 of the transmission without an intermediate layer of a plastic carrier plate 4. In both exemplary embodiments in FIG. 1 and FIG. 2, no electrically conductive parts are provided on the underside 16 of the printed circuit board 5, with the result that it is not necessary to take any measures for insulating the electrically conductive parts on this side, and in particular a swarf protection cover does not have to be arranged on the underside 16, since no electrical connection pins project through as far as the underside 16. Therefore, there is also no need for a further cover plate on the underside 16 of the printed circuit board 5 in order to bring about a level connecting face, since the level underside 16, on which there are no electrically conductive parts, can be applied directly to the transmission hydraulic plate 2.

Figure 3:
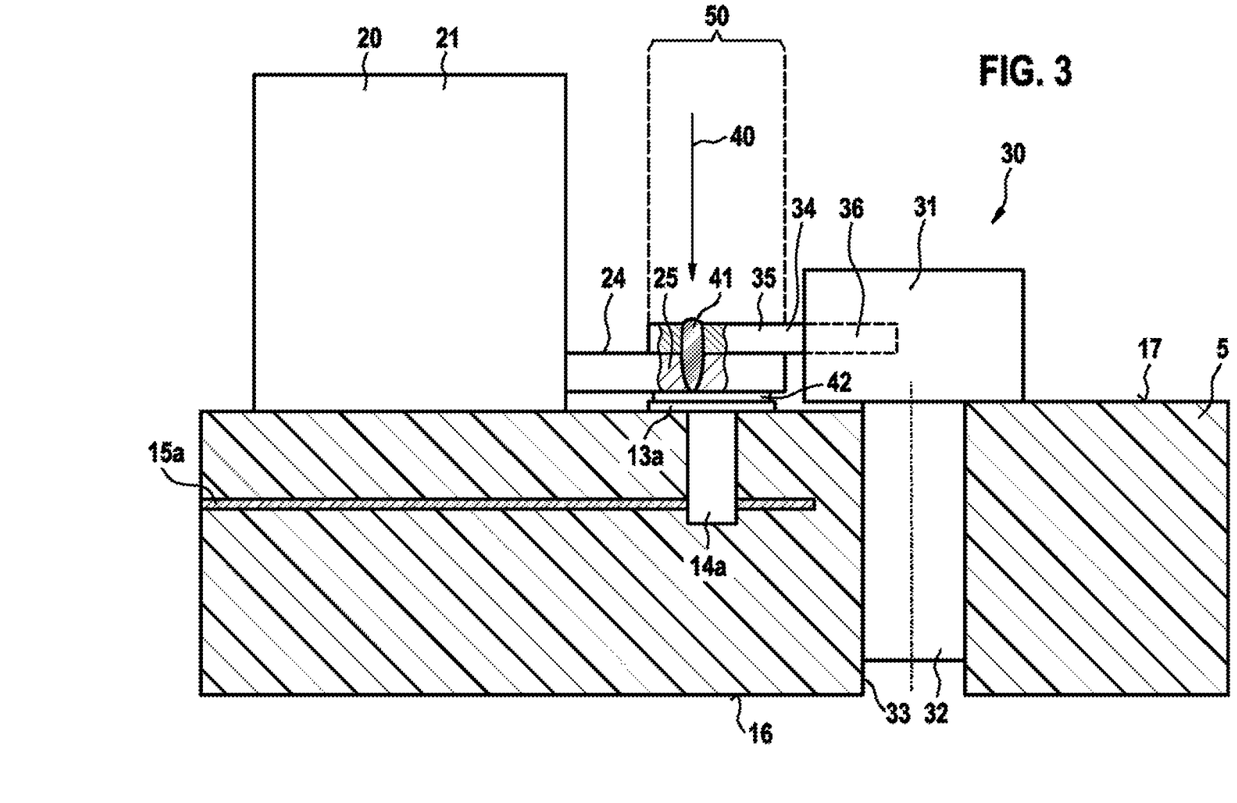
FIG. 3 shows a view of a detail from FIG. 1, which view shows the formation of contact between the connection element, metallic web and contact area in an enlarged illustration.

FIG. 3 shows a view of a detail from FIG. 1 in the region of the electrical connection of the electrical component 20, which is, for example, a sensor component 21. As is apparent in FIG. 3, an inner conductor track 15a of the printed circuit board 5 is electrically connected to a contact area 13a on the component side 17 of the printed circuit board 5 via an intermediate connector 14a. On the contact area 13a there is an electrically conductive material 42. This can be, for example, a curable adhesive or a solder. In the exemplary embodiment shown here, the material 42 is a solder. The electrical component 20 is fitted directly as a surface-mounted component (SMD, surface-mounted device) onto the component side 17. The electrical component has connection elements 24 with a preferably rectangular cross section. In FIG. 3, just one connection element 24 can be seen. The connection elements 24 run parallel to the component side 17. It is important that the connection elements 24 have, in the end position on the printed circuit board 5, a connection section 25 which runs parallel to the component side 17. The connection elements can, in contrast to what is shown in FIG. 3, also have bends or kinks between the connection section 25 and the electrical component 20. In the exemplary embodiment shown in FIG. 3, the connection section 25 is arranged directly over the material 42, that is to say the solder, and is connected in a materially joined and electrically conductive fashion to the contact area 13a by means of the solder.

Furthermore, FIG. 3 illustrates an adapter 30. The adapter 30 has a holding body 31 with a, for example, parallelepiped-shaped geometry, which is attached to the printed circuit board 5. This can be embodied in different ways. It is possible, for example, to secure the holding body 31 to the printed circuit board 5 by means of positively locking, frictionally locking or materially joined attachment means. It is important that the holding body 31 is attached in such a way that it can absorb mechanical stresses. The preferred adapter 31 which is illustrated in FIG. 3 therefore has a holding body 31 which is embodied with one or more attachment pins 32. The attachment pin 32 protrudes perpendicularly from the holding body 31 on the underside thereof. The attachment pin 32 can be produced together with the holding body 31 by means of injection molding. In this context, at least one metallic web 34 is partially injection molded into the holding body 31. The metallic web 31 is embodied, for example, as a metal strip with a rectangular cross section and is preferably composed of the same material as the connection elements 24 of the component 2. For example, both can be composed of copper. Independently of the material selected for the metallic web 34, it is advantageous but not necessary for the metallic web 34 to have a similar thermal expansion behavior to the connection element 24. As can be seen in FIG. 3, the metallic web 35 has an end section 36 which is completely embedded in the holding body 31, and a contact section 35 which protrudes laterally from the holding body 31. The metallic web can have bends or kinks between the contact section 35 and the holding body 31. In the exemplary embodiment illustrated here, the metallic web is produced as a sheet metal part by punching and is of essentially level design. The contact section 35 of the metallic web 34 lies flat on the connection section 24. The contact section 35 and the connection section 25 run parallel to the printed circuit board 5, and the contact section 35 is arranged directly over the connection section 25 in an overlapping region 50, with the result that said contact section 35 rests flat on the connection section 25 in the overlapping region 50. In the overlapping region 50, the contact section 35 is welded to the connection section 25. The electrical connection which is produced between the connection element 24 and the contact area 13a by soldering or by conductive adhesive is stabilized and relieved of loading by the adapter. As illustrated schematically in FIG. 1 and FIG. 2, a protective cover 51 can finally be applied in the region of the welding point 41. Said protective cover 51 preferably covers the entire contact section 35 and the connection section 25 completely and protects against short circuits as a result of metal swarf. The protective cover 51 can be produced, for example, by means of a protective surface coating, casting material or the like.

During the production of the structure described in FIG. 3, firstly a printed circuit board 5, which can already be provided with the circuit part 7, the power part 6 and the cover 8 and which has contact areas 13a, provided with a conductive material 42, in particular with a solder material application, on the component side 17 outside the area covered by the cover 8, is equipped with the at least one electrical component 20. In this context, the connection section 25 of the connection element 24 is preferably arranged directly over the contact area 13a which is provided with the electrically conductive material 42. Then, the connection section 25 can be soldered to the contact area 13a. However, this can also be done later after the application of one or more adapters 30. Finally, the printed circuit board 5 is populated with the adapters 30, wherein an adapter 30 is pressed, for example, with the attachment pin 32 into the insertion opening 33 until the contact section 35 of the metallic web 34 rests flat on the connection section 25 in the overlapping region 50, on the side of said connection section 25 facing away from the contact area 13a. The connection section 25 and the contact section 35 run essentially parallel to the component side 17 of the printed circuit board 5 in the overlapping region. Then, a welded connection 41 is produced in the direction of the arrow 40 in FIG. 3 by means of a laser. The laser is directed onto the overlapping region 50 here perpendicularly with respect to the printed circuit board 5, and partially melts the contact section 35 and the connection section 25 lying underneath it, until a welded connection 41 is produced. Owing to the large overlapping region 50, the welding process is hardly adversely affected by positional tolerances of the components. Welding is carried out, for example, with a green laser light.

Such lasers are advantageously used for splash-free and low-energy welding of thin copper materials. The welding process can be carried out in such a way that the inputting of heat during the welding also melts the soldered layer under the connection section 25, with the result that at the same time the connection section 25 is soldered to the contact area 13a. In addition to this, it is advantageous if the contact area 13a is arranged directly underneath the overlapping region 50 or inside the projection of the overlapping region 50 in the direction 40, because the heat then reaches the soldered deposit on the contact area 13a directly.

The production of the electrical connections is advantageously achieved in just one working step which can be carried out at a high speed in an automatic fabrication system. A well handled soldering process or curing process of an adhesive is also optionally previously carried out for the materially joined connection of the connection element 24 to the contact area 13a. This can be simultaneously carried out for example, in the vapor phase soldering for all the soldering points.

An alternative production method will be explained with reference to FIG. 4. In this method, firstly, a printed circuit board 5, which can already be provided with the circuit part 7, the power part 6 and the cover 8 and which has contact areas 13a on the component side 17 outside the region covered by the cover 8, said contact areas 13a being provided with a conductive material 42, in particular with an application of solder material is, in contrast to the exemplary embodiment in FIG. 3, firstly populated with the adapter 30. The attachment pin 32 is pressed into the insertion opening 33 here until the contact section 35 rests on the material 42, parallel to the component side 17. Subsequently, the contact section 35 can be connected in a materially joined fashion to the contact area 13a, which can be done, for example, by soldering, in particular vapor phase soldering, if the material 42 is a solder. However, this can also be done later. Then, at least one electrical component 20 is arranged on the printed circuit board 5 which is provided with the at least one adapter 30, wherein the at least one electrical component 20 has at least one electrical connection element 24 which has a connection section 25 which runs parallel to the component side 17 of the printed circuit board 5. The connection section 25 is arranged resting directly on the contact section 35, in an overlapping region 50. Then, a welded connection 41 is produced in the direction of the arrow 40 in FIG. 4 by means of a laser. The laser is directed onto the overlapping region 50 here perpendicular to the printed circuit board 5 and partially melts the connection section 25 and the contact section 35 lying under it until a welded connection 41 is produced. The welding process can be carried out in such a way that the inputting of heat during the welding also melts the solder layer under the contact section 35, with the result that at the same time the contact section 35 is soldered to the contact area 13a.

Of course, it goes without saying that the production methods which are described with reference to FIGS. 3 and 4 can also be combined.

Figure 5A:
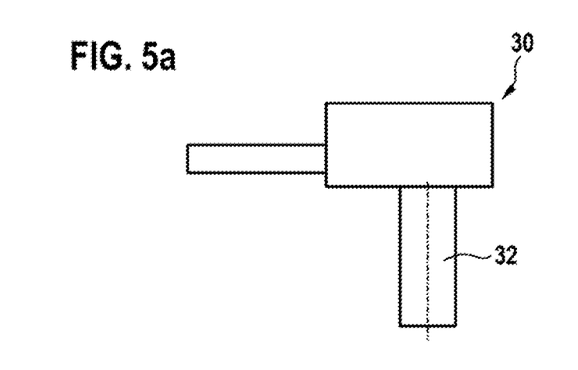
Figure 5B:
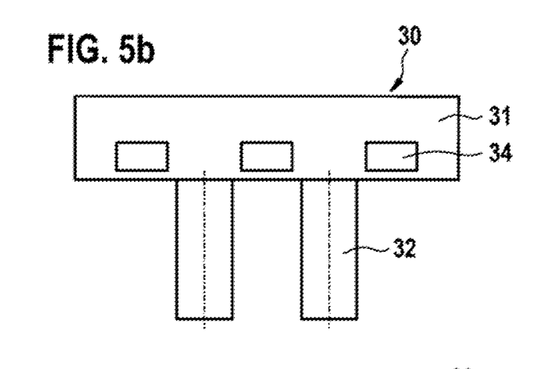
Figure 5C:
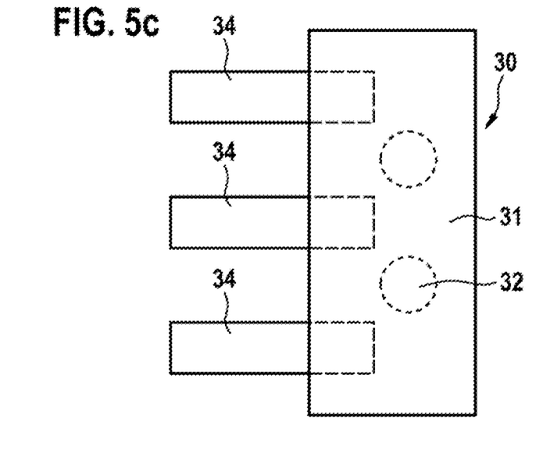

FIGS. 5a to 5c show various side views of an exemplary embodiment of the adapter 30. As is apparent in FIG. 5c, the adapter 30 can, for example, also have two or more attachment pins 32. Furthermore, a plurality of metallic webs 34 can be secured to the holding body 31 of the adapter 30. In the example in FIG. 5b, these are three metallic webs 34 which serve to form contacts with three connection elements 24 of a component 20.

Figure 6:
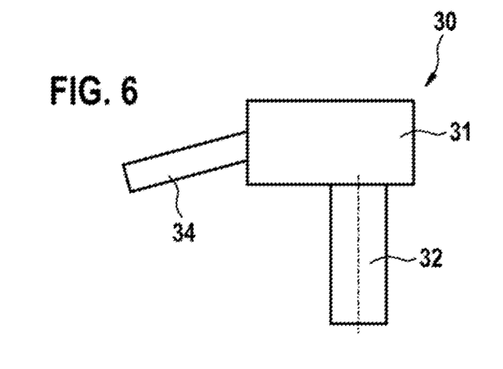
FIG. 6 shows a side view of a further exemplary embodiment for the adapter.

FIG. 6 illustrates the fact that a metallic web 34 can also be positioned obliquely on the holding body 31, with the result that in its initial position said metallic web 34 is not oriented precisely perpendicularly with respect to the attachment pin 32. Only when the adapter 30 is pressed into the printed circuit board is the metallic web pressed against the contact area 13a or the connection section 25 of a component, and in the process bent back elastically, with the result that the contact section 35 is oriented parallel to the component side 17 of the printed circuit board 5. A prestressing force, which acts in the direction of the contact area 13a (FIG. 4) or in the direction of the connection section 25 (FIG. 3) is advantageously produced here.

This can advantageously ensure that when solder melts on the contact area 13a, the contact section 35 or the connection section 25, depending on which is to be soldered to the contact area 13a, does not inadvertently lift out of the molten-on solder.

Figure 4:
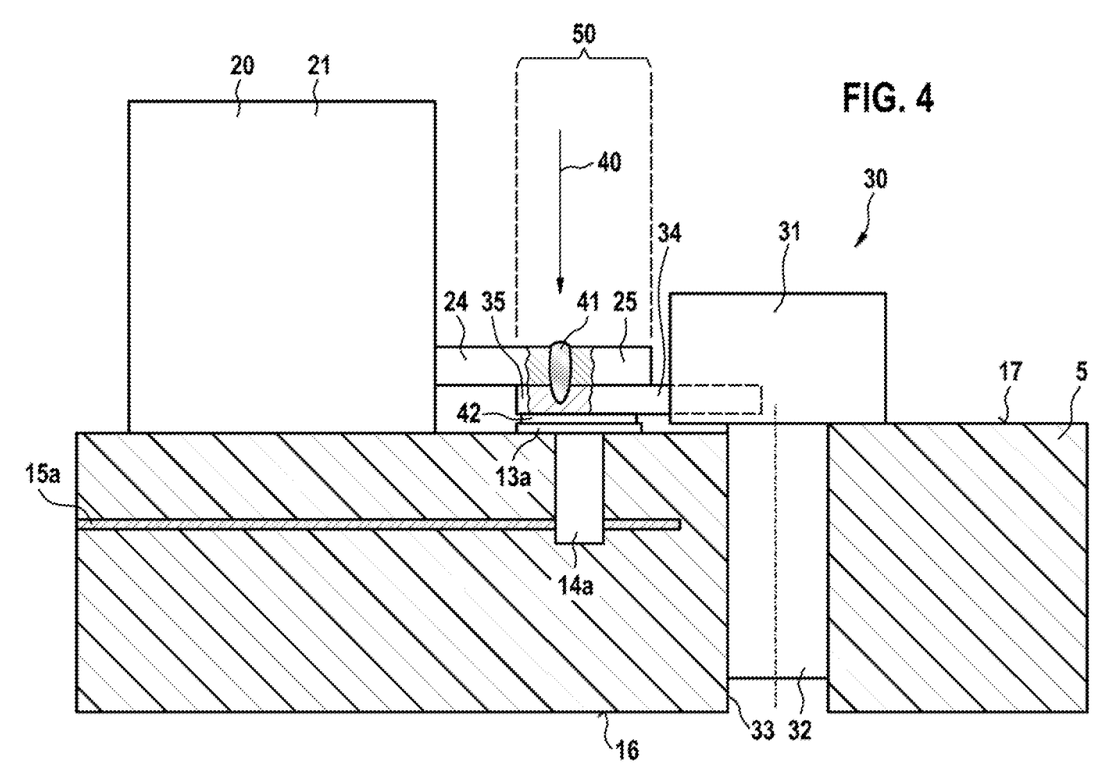
Figure 7A:
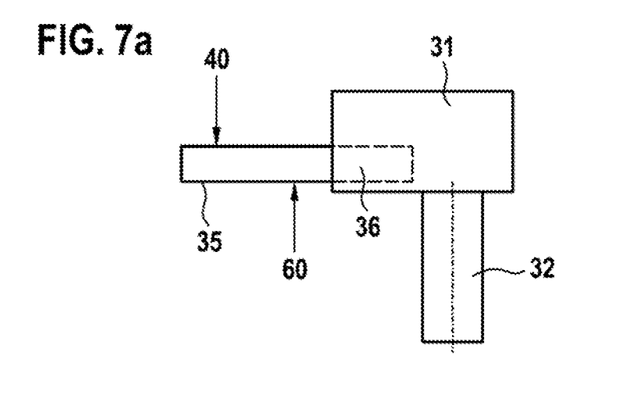
FIGS. 7a to 7c show a side view, in each case of an adapter with characterization of positions which are provided for producing the welded connection, and for the soldering process.
Figure 7B:
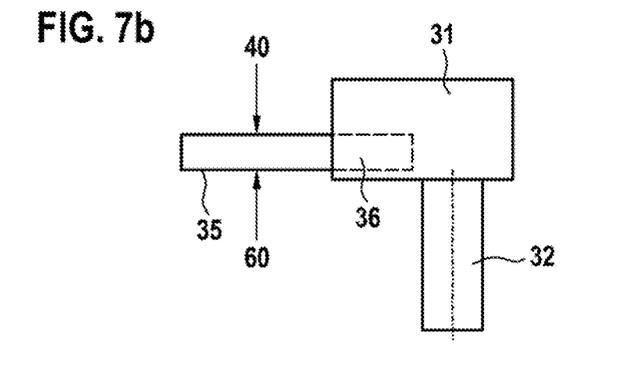
Figure 7C:
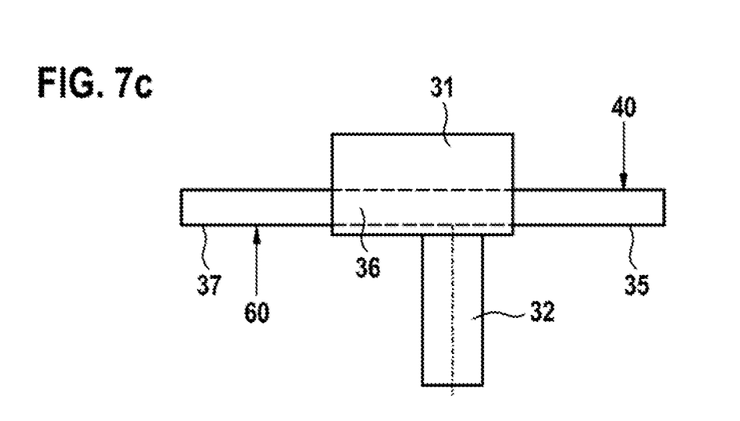

FIGS. 7a and 7c show further exemplary embodiments, and here the illustration in FIG. 7b corresponds to the structure according to FIG. 3 or FIG. 4, in which the welding takes place in the direction of the arrow 40 directly above the position 60 which is provided for the manufacture of a materially joined connection between the metallic web 34 and the contact area 13a or between the connection element 24 and the contact area 13a.

FIG. 7a illustrates that the welding in the direction of the arrow 40 can also be arranged laterally offset with respect to the soldering point 60. This means that in this exemplary embodiment the materially joined electrical connecting point of the metallic web 34 to the contact area 13a of the printed circuit board 5 does not have to be located, when viewed in the direction of the arrow 40, underneath the overlapping region of the contact section 35 and the connection section 25.

In the exemplary embodiment in FIG. 7c, the metallic web is led out from the holding body 31 on both sides. The dashed line marks the central section 36, embedded in the holding body 31, of the metallic web 35. On a side of the holding body 31, which lies opposite the contact section 35 which is provided for the production of the welded connection, a further section 37 protrudes from the holding body 31, said section 37 being provided for the production of a materially joined connection to a contact area 13a. The section 37 can, of course, also protrude from the holding body 31 at another location, for example at a right angle to the contact section 35, but still parallel to the component side 17.

The invention claimed is:

1. An electronic control module, comprising:
a printed circuit board with a component side, on which at least one contact area is arranged;
at least one electrical component with at least one electrical connection element which has a connection section which runs parallel to the component side of the printed circuit board and is electrically connected to the at least one contact area; and
at least one adapter arranged on the printed circuit board, independently of the at least one electrical component, as a separate part on the printed circuit board,
wherein the adapter has a holding body, which is attached to the printed circuit board outside the at least one contact area, and at least one metallic web, which is arranged on the holding body and has a contact section running parallel to the component side of the printed circuit board,
wherein the contact section of the at least one metallic web and the connection section of the at least one electrical connection element are arranged, when viewed in a direction perpendicular to the printed circuit board, resting one on the other in an overlapping region and are welded to one another in the overlapping region,
wherein one of the at least one metallic web and the at least one electrical connection element is placed in electrical contact with the at least one contact area via an electrically conductive material applied to the at least one contact area,
wherein the connection section of the at least one electrical connection element is in direct contact with the electrically conductive material on the at least one contact area of the printed circuit board, and
wherein the contact section of the at least one metallic web is configured to rest on the connection section, on a side of the connection section which faces away from the at least one contact area.

2. The electronic control module as claimed in claim 1, wherein the holding body has at least one attachment pin inserted into an insertion opening in the printed circuit board.

3. The electronic control module as claimed in claim 2, wherein the at least one attachment pin is pressed into the insertion opening.

4. The electronic control module as claimed in claim 1, wherein the holding body is fabricated from plastic.

5. The electronic control module as claimed in claim 1, wherein the at least one metallic web is configured to project laterally from the holding body, parallel to the printed circuit board, at least on one side of the holding body.

6. The electronic control module as claimed in claim 1, wherein the at least one contact area of the printed circuit board is arranged, when viewed in a direction perpendicular to the printed circuit board, underneath the overlapping region of the contact section and connection section.

7. The electronic control module as claimed in claim 1, wherein the contact section of the at least one web and the connection section of the at least one electrical connection element are metal strips which have a rectangular cross section and are arranged resting flat on top of one another at least in the overlapping region.

8. A method for producing an electronic control module, comprising:
making available a printed circuit board with a component side on which at least one contact area is arranged;
applying an electrically conductive material to the at least one contact area;
arranging at least one adapter on the printed circuit board, the at least one adapter having a holding body, which is configured to be attached to the printed circuit board outside the at least one contact area, and at least one metallic web, which is arranged on the holding body and has a contact section running parallel to the component side of the printed circuit board at least in an end position of the adapter in which it is attached to the printed circuit board, the at least one metallic web arranged directly over the at least one contact area;

arranging at least one electrical component on the printed circuit board, the at least one electrical component having at least one electrical connection element, which has a connection section running parallel to the component side of the printed circuit board, the connection section arranged resting directly on the contact section in an overlapping region; and welding the connection section to the contact section, wherein the connection section of the at least one electrical connection element is in direct contact with the electrically conductive material on the at least one contact area of the printed circuit board and is electrically connected to the at least one contact area, wherein the contact section of the at least one metallic web is configured to rest on the connection section, on a side of the connection section which faces away from the at least one contact area, and wherein the at least one adapter is arranged independently of the at least one electrical component, as a separate part on the printed circuit board.

9. The method as claimed in claim 8, further comprising:

before arranging the at least one electrical component on the printed circuit board, connecting the at least one metallic web to the contact area via the electrically conductive material in a materially joined fashion.

10. The method as claimed in claim 8, wherein:

the electrically conductive material is a solder, and during welding the connection section to the contact section, the contact section is simultaneously soldered to the contact area via the input of heat from the welding process.

\* \* \* \* \*